United States Patent
Takahashi

(10) Patent No.: US 11,605,625 B2
(45) Date of Patent: *Mar. 14, 2023

(54) SEMICONDUCTOR DEVICE AND MANUFACTURING METHOD THEREFOR, SOLID-STATE IMAGING ELEMENT, AND ELECTRONIC EQUIPMENT

(71) Applicant: SONY SEMICONDUCTOR SOLUTIONS CORPORATION, Kanagawa (JP)

(72) Inventor: Hiroshi Takahashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 47 days.

This patent is subject to a terminal disclaimer.

(21) Appl. No.: 17/141,675

(22) Filed: Jan. 5, 2021

(65) Prior Publication Data
US 2021/0125978 A1    Apr. 29, 2021

Related U.S. Application Data

(63) Continuation of application No. 16/477,963, filed as application No. PCT/JP2018/000232 on Jan. 10, 2018, now Pat. No. 10,916,538.

(30) Foreign Application Priority Data

Jan. 24, 2017    (JP) .................. 2017-010053

(51) Int. Cl.
*H01L 27/02* (2006.01)
*H01L 21/768* (2006.01)
(Continued)

(52) U.S. Cl.
CPC .... *H01L 27/0255* (2013.01); *H01L 21/76898* (2013.01); *H01L 23/481* (2013.01);
(Continued)

(58) Field of Classification Search
None
See application file for complete search history.

(56) References Cited

U.S. PATENT DOCUMENTS 8,441,104 B1    5/2013  Hu et al.
10,916,538 B2*  2/2021  Takahashi ........... H01L 27/0255
(Continued)

FOREIGN PATENT DOCUMENTS

CN    101715076    5/2010
CN    101715081    5/2010
(Continued)

OTHER PUBLICATIONS

Powell, "The Importance of DC Self Bias in Plasma Applications," Palomar Technologies, Jun. 1, 2016, 4 pages.
(Continued)

*Primary Examiner* — J. E. Schoenholtz
(74) *Attorney, Agent, or Firm* — Sheridan Ross P.C.

(57) ABSTRACT

The present technology relates to a semiconductor device and a manufacturing method therefor, a solid-state imaging element and electronic equipment that make it possible to suppress breakdown of a side wall insulating film by charge damage to suppress short-circuiting. The semiconductor device according to an aspect of the present technology includes a first semiconductor substrate on which a given circuit is formed, a second semiconductor substrate, and through electrodes that electrically connect the first semiconductor substrate and the second semiconductor substrate to each other. The through electrode is formed such that a through-hole is opened through a protection diode structure
(Continued)

formed in the first semiconductor substrate, an insulating film is deposited on a side wall of the through-hole, and an electrode material is then filled inside the through-hole in which the insulating film is deposited. The present technology can be applied, for example, to a CMOS image sensor.

15 Claims, 14 Drawing Sheets

(51) Int. Cl.
*H01L 23/48* (2006.01)
*H01L 25/00* (2006.01)
*H01L 27/146* (2006.01)

(52) U.S. Cl.
CPC .......... *H01L 25/50* (2013.01); *H01L 27/0296* (2013.01); *H01L 27/1469* (2013.01); *H01L 27/14634* (2013.01); *H01L 27/14636* (2013.01)

(56) References Cited

U.S. PATENT DOCUMENTS

| | | |
|---|---|---|
| 2010/0079638 A1 | 4/2010 | Hwang |
| 2010/0237386 A1 | 9/2010 | Lin et al. |
| 2011/0233702 A1 | 9/2011 | Takahashi et al. |
| 2012/0153419 A1* | 6/2012 | Itonaga ................. H01L 23/552 438/66 |
| 2013/0119502 A1 | 5/2013 | Hu et al. |
| 2013/0193547 A1 | 8/2013 | Nakazawa |
| 2013/0321680 A1 | 12/2013 | Kumano |
| 2014/0061874 A1* | 3/2014 | Kim ................. H01L 21/76898 257/653 |
| 2016/0260756 A1 | 9/2016 | Yamagishi |
| 2017/0162625 A1 | 6/2017 | Takayanagi et al. |
| 2020/0083168 A1 | 3/2020 | Wu et al. |

FOREIGN PATENT DOCUMENTS

| | | |
|---|---|---|
| CN | 101740592 | 6/2010 |
| CN | 105409002 | 3/2016 |
| JP | 2011-204915 | 10/2011 |
| JP | 2013-251391 | 12/2013 |
| TW | 200400627 | 4/2004 |
| WO | WO 2005/101475 | 10/2005 |
| WO | WO 2015/068588 | 5/2015 |
| WO | WO 2016/009943 | 4/2017 |

OTHER PUBLICATIONS

International Search Report prepared by the Japan Patent Office dated Jan. 31, 2018 for International Application No. PCT/JP2018/000232.
Official Action for U.S. Appl. No. 16/477,963, dated Jul. 1, 2020, 15 pages.
Notice of Allowance for U.S. Appl. No. 16/477,963, dated Oct. 9, 2020, 9 pages.
Official Action (with English translation) for China Patent Application No. 201880007138.0, dated Nov. 28, 2022, 19 pages.

* cited by examiner

US 11,605,625 B2

SEMICONDUCTOR DEVICE AND MANUFACTURING METHOD THEREFOR, SOLID-STATE IMAGING ELEMENT, AND ELECTRONIC EQUIPMENT

CROSS REFERENCE TO RELATED APPLICATIONS

This application is a continuation application of U.S. patent application Ser. No. 16/477,963 filed Jul. 15, 2019, which is a national stage application under 35 U.S.C. 371 and claims the benefit of PCT Application No. PCT/JP2018/000232 having an international filing date of 10 Jan. 2018, which designated the United States, which PCT application claimed the benefit of Japanese Patent Application No. 2017-010053 filed 24 Jan. 2017, the entire disclosures of each of which are incorporated herein by reference.

TECHNICAL FIELD

The present disclosure relates to a semiconductor device and a manufacturing method therefor, a solid-state imaging element and electronic equipment, and particularly relates to a semiconductor device and a manufacturing method therefor, a solid-state imaging element and electronic equipment suitable for use in the case where semiconductor substrates stacked on each other are electrically connected to each other by a through electrode.

BACKGROUND ART

In the past, as electronic equipment configured by stacking a plurality of semiconductor substrates, an amplification type solid-state imaging element represented by a MOS type image sensor such as a CMOS (Complementary Metal Oxide Semiconductor), a multilayer stacked memory, and so forth have been known (for example, refer to PTL 1).

FIG. 1 is a sectional view depicting an example of a related-art configuration of electronic equipment configured by stacking a plurality of semiconductor substrates.

The electronic equipment is configured such that a first semiconductor substrate 11 is stacked on a second semiconductor substrate 12 and a through electrode 13 is formed by filling a through-hole (penetrating hole) extending through the two semiconductor substrates with an electrode material (a metal material such as, for example, Cu) to electrically connect a wiring line of the first semiconductor substrate 11 of the upper layer and a wiring line of the second semiconductor substrate 12 of the lower layer with each other.

FIG. 2 is an enlarged view depicting a cross section of the first semiconductor substrate 11 in which the through electrode 13 is formed. In the case where the through electrode 13 is formed in the first semiconductor substrate 11 (hereinafter referred to also as an Si substrate 11) represented by an Si substrate, it is necessary to electrically isolate the inside of the Si substrate 11 having conductivity and the through electrode 13 from each other, and generally, after an insulating film (hereinafter referred to as a side wall insulating film) 23 represented by an SiO$_2$ film or an SiN film is deposited on a side wall of the Si substrate 11 in which a through-hole is formed, an electrode material 24 is filled to form a through electrode 13.

Although an insulation resistance of the side wall insulating film 23 increases as a thickness thereof increases, there is a limitation from the point of view of a throughput or fine processing, and it is desirable that the side wall insulating film 23 is controlled to an appropriate thickness.

Incidentally, it is generally known that, if the through-hole is opened in the Si substrate 11 by dry etching, a charge is accumulated into a P well region 22 of the Si substrate 11 by plasma damage caused by dry etching. Further, it is known that, if such charge damages are connected directly to the gate electrode of a MOS transistor, then the gate insulating film is destroyed.

Furthermore, a phenomenon that destruction occurs also with portions other than the gate insulating film of the MOS arising from charge damage has been confirmed by the inventor of the present technology.

In particular, it has been confirmed that, if a through-hole is opened in the P well region 22 of the Si substrate 11 and the side wall insulating film 23 is deposited and then the electrode material 24 is filled to form the through electrode 13, then charge accumulated in the boundary between the P well region 22 and the insulating film layer (hereinafter referred to as an STI (Shallow Trench Isolation)) 21 breaks down the side wall insulating film 23 to make a cause of a leakage current failure.

CITATION LIST

Patent Literature

[PTL 1]
JP 2011-204915A

SUMMARY

Technical Problem

A cause of the breakdown phenomenon of the side wall insulating film 23 is described in detail with reference to FIGS. 3 and 4.

The breakdown phenomenon of the side wall insulating film 23 arises from injection of a charge arising from plasma damage upon opening by dry etching when the through-hole 31 penetrates the P well region 22 and then reaches the STI 21, into the STI 21 through the P well region 22 as indicated by a × mark in FIG. 3, and accumulation of the charge thus injected as fixed charge.

The charge accumulated in the through-hole is not strong enough by itself to cause insulation breakdown. However, charge by plasma damage, which is generated in the case where a plurality of through-holes 31 is opened in the P well region 22 by dry etching, can freely move around in the P well region 22 until the through-holes 31 reach the STI 21, and when the through-holes 31 reach the STI 21, a large amount of charge having moved around in the P well region 22 is trapped by the STI 21, and therefore, charge damage is accumulated.

In the case where a plurality of through-holes 31 is opened to the Si substrate 11, since the processing speed or the thickness of the Si substrate 11 is not uniform, the period of time within which a through-hole 31 that reaches the STI 21 first is exposed to etching and the period of time within which another through-hole 31 reaches the STI 21 last is exposed to etching are different from each other. Therefore, much charge is accumulated in a concentrated manner in the through-hole 31 that reaches the STI 21 first, and the accumulated charge remains until the through-hole formation process is completed.

Further, when the side wall insulating film 23 is deposited in each through-hole 31 formed in the P well region 22 to fill up the electrode material 24 as depicted in FIG. 4, the potential of the through electrode 13 is fixed, and therefore, the charge accumulated in the proximity of the boundary between the P well region 22 and the STI 21 becomes fixed charge, which applies a local strong electric field toward the filled electrode material 24. Therefore, such a breakdown phenomenon that the side wall insulating film 23 at a position indicated by a broken line round mark in FIG. 4 and so forth is broken down and part of the electrode material 24 enters the inside of the side wall insulating film 23 toward the P well region 22 becomes observed. Consequently, this causes short-circuiting between the P well region 22 and the electrode material 24, and leak current is generated.

The present technology has been made in view of such a situation as described above and makes it possible to suppress breakdown of a side wall insulating film by charge damage to suppress short-circuiting that could have occurred between a semiconductor substrate and a through electrode.

Solution to Problem

A semiconductor device according to a first aspect of the present technology includes a first semiconductor substrate on which a given circuit is formed, a second semiconductor substrate pasted to the first semiconductor substrate, and through electrodes electrically connecting the first semiconductor substrate and the second semiconductor substrate to each other, and in which each of the through electrodes is formed such that a through-hole is opened through a protection diode structure formed in the first semiconductor substrate, an insulating film is deposited on a side wall of the through-hole, and an electrode material is then filled inside the through-hole in which the insulating film is deposited.

The through electrode may be formed such that the through-hole is opened through the protection diode structure including a well region of one of a P type and an N type formed in the first semiconductor substrate and a diffusion layer of the other of the P type and the N type stacked and formed in the well region, and the insulating film is deposited on the side wall of the through-hole and the electrode material is then filled in the through-hole in which the insulating film is deposited.

The protection diode structure may be formed for each of the through electrodes.

The diffusion layer of the other of the P type and the N type stacked and formed on the well region may be formed in a recessed portion of an STI provided individually for each of the through electrodes.

A manufacturing method according to the first aspect of the present technology is a manufacturing method of a semiconductor device that includes a first semiconductor substrate on which a given circuit is formed, a second semiconductor substrate pasted to the first semiconductor substrate, and through electrodes electrically connecting the first semiconductor substrate and the second semiconductor substrate to each other, the manufacturing method including forming a diffusion layer of one of a P type and an N type on the first semiconductor substrate and stacking a well region of the other of the P type and the N type on an upper layer of the diffusion layer to form a protection diode structure, pasting the first semiconductor substrate in which the protection diode structure is formed, and the second semiconductor layer to each other, opening a through-hole through the protection diode structure from the first semiconductor substrate side, depositing an insulating film on a side wall of the opened through-hole, and filling up an electrode material inside the through hole in which the insulating film is deposited, to form the through electrode.

A solid-state imaging element according to a second aspect of the present technology includes a first semiconductor substrate on which at least a photoelectric conversion element and a pixel transistor are formed, a second semiconductor substrate pasted to the first semiconductor substrate, and through electrodes electrically connecting the first semiconductor substrate and the second semiconductor substrate to each other, in which each of the through electrodes is formed such that a through-hole is opened through a protection diode structure formed in the first semiconductor substrate and an insulating film is deposited on a side wall of the through-hole and besides an electrode material is then filled inside the through-hole in which the insulating film is deposited.

Electronic equipment according to a third aspect of the present technology is electronic equipment in which a semiconductor device is incorporated, the semiconductor device including a first semiconductor substrate on which a given circuit is formed, a second semiconductor substrate pasted to the first semiconductor substrate, and through electrodes electrically connecting the first semiconductor substrate and the second semiconductor substrate to each other, in which each of the through electrodes is formed such that a through-hole is opened through a protection diode structure formed in the first semiconductor substrate, an insulating film is deposited on a side wall of the through-hole, and an electrode material is then filled inside the through-hole in which the insulating film is deposited.

Advantageous Effect of Invention

According to the first to third aspects of the present technology, short-circuiting that could have occurred between the first semiconductor substrate and the through electrode can be suppressed.

DESCRIPTION OF EMBODIMENT

In the following, a mode for carrying out the present technology (hereinafter referred to as an embodiment) is described in detail with reference to the drawings.

<Configuration Example of Electronic Equipment that is Embodiment of Present Technology>

Figure 1:
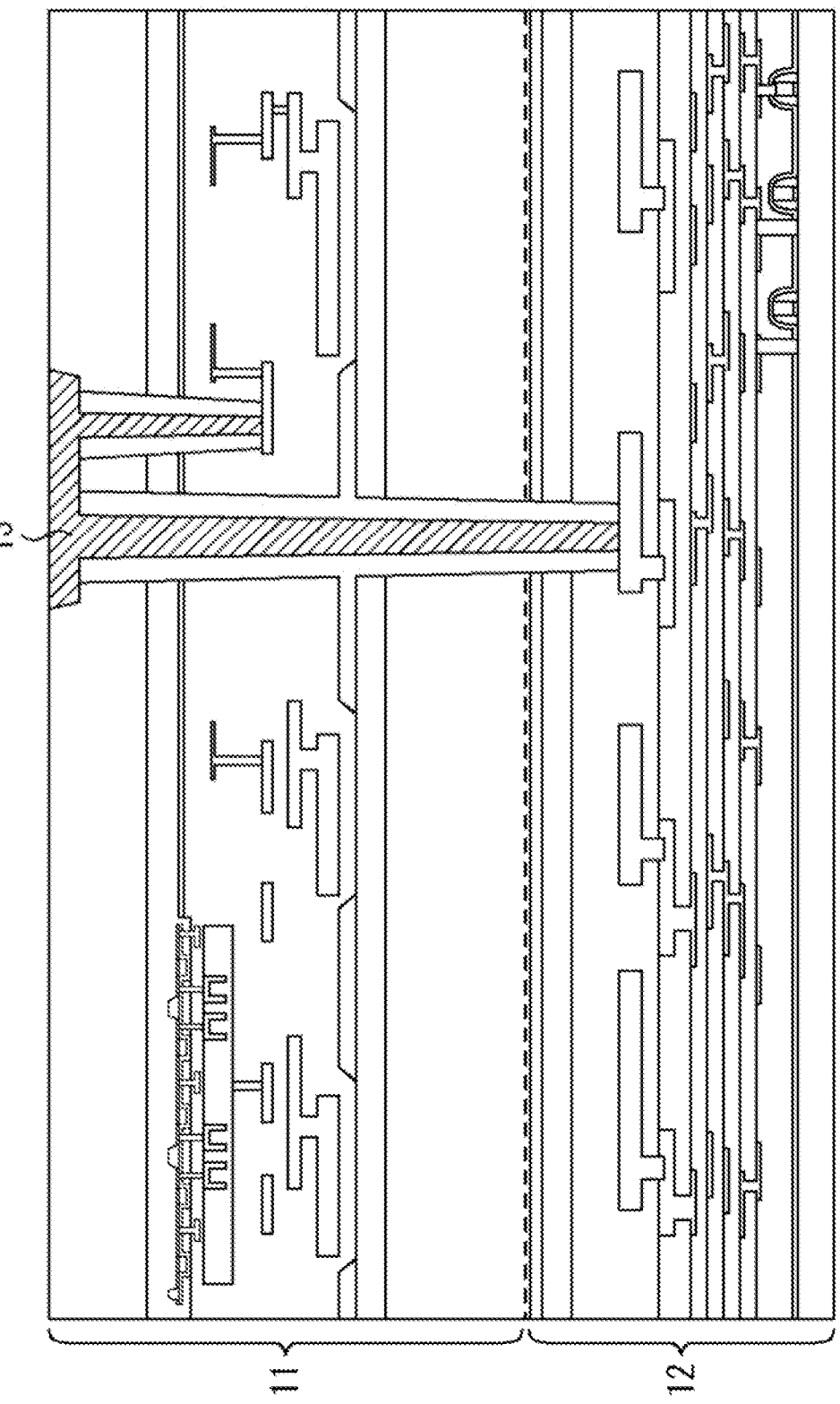
FIG. 1 is a sectional view depicting an example of a related-art configuration of electronic equipment configured by stacking a plurality of semiconductor substrates.
Figure 5:
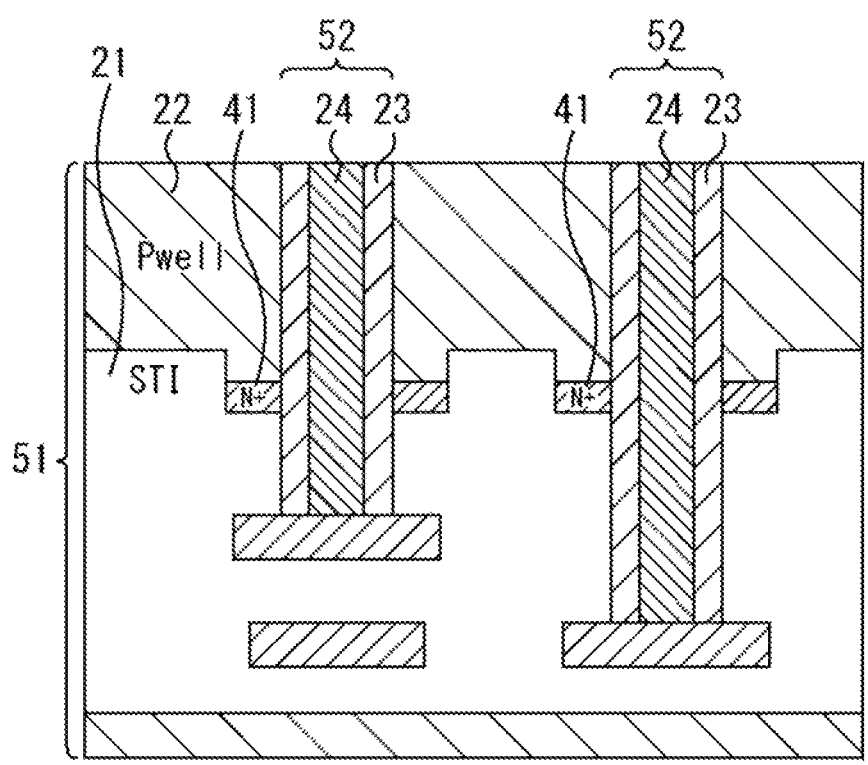
FIG. 5 is a sectional view depicting a configuration example of electronic equipment including a plurality of semiconductor substrates stacked on each other, to which the present technology is applied.

FIG. 5 depicts a configuration example of electronic equipment that is an embodiment of the present technology. It is to be noted that, since components common to those of the related-art configuration depicted in FIG. 1 are denoted by like reference symbols, description of them is suitably omitted.

The electronic equipment is formed by stacking a first semiconductor substrate (hereinafter referred to also as an Si substrate) 51 and a second semiconductor substrate (not depicted) and electrically connecting a wiring line of the first semiconductor substrate 51 of an upper layer and a wiring line of the second semiconductor substrate of a lower layer by a through electrode 52 that extends through the two semiconductor substrates.

Figure 2:
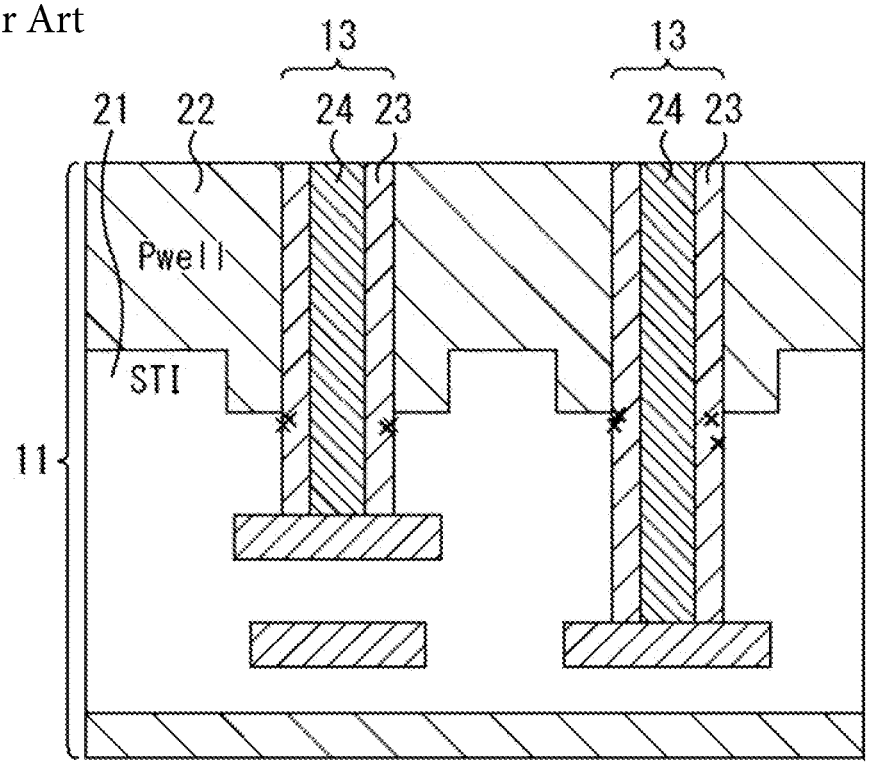
FIG. 2 is an enlarged view depicting a cross section of a first semiconductor substrate in which a through electrode is formed.
Figure 3:
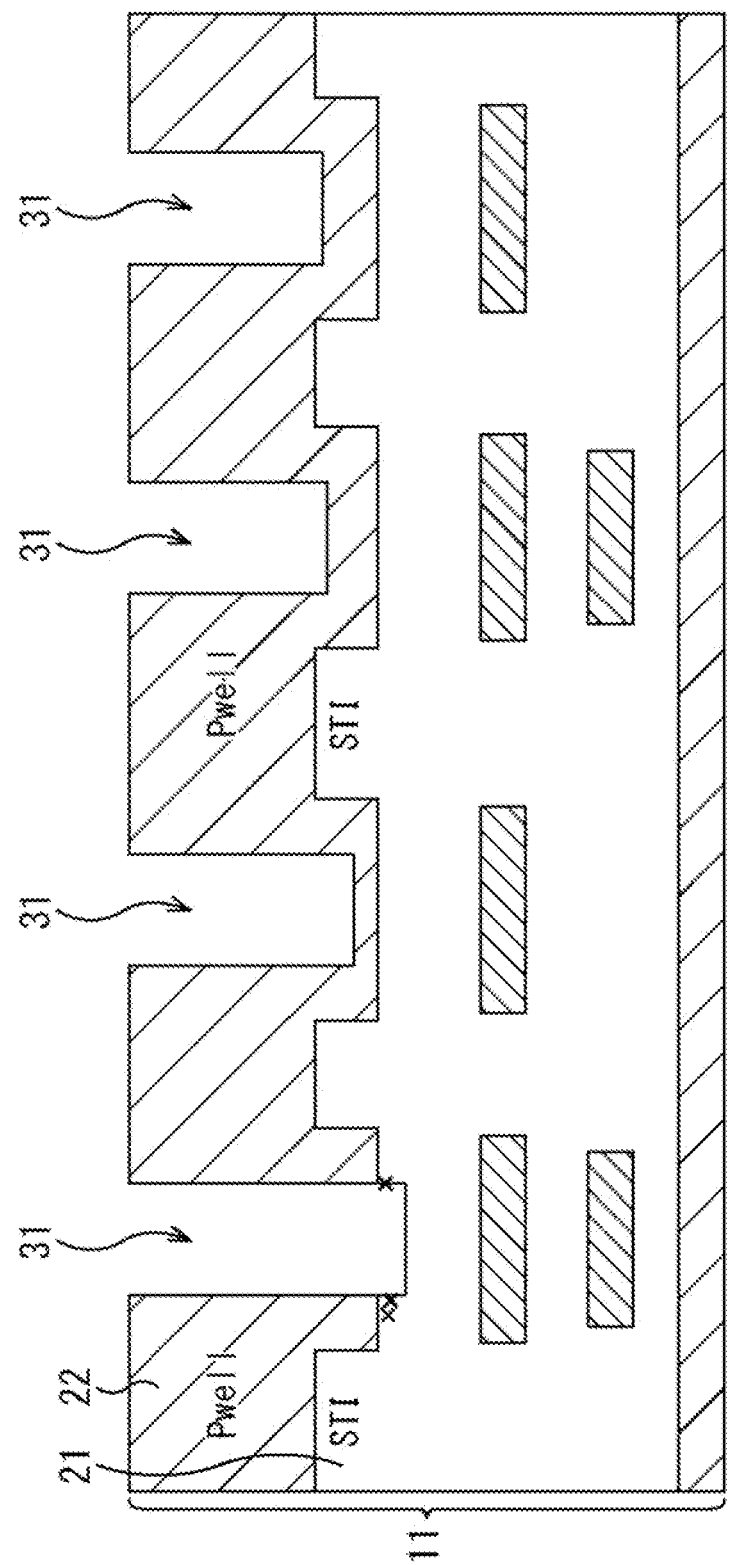
FIG. 3 is a view illustrating a cause of a breakdown phenomenon of a side wall insulating film of an Si substrate.
Figure 4:
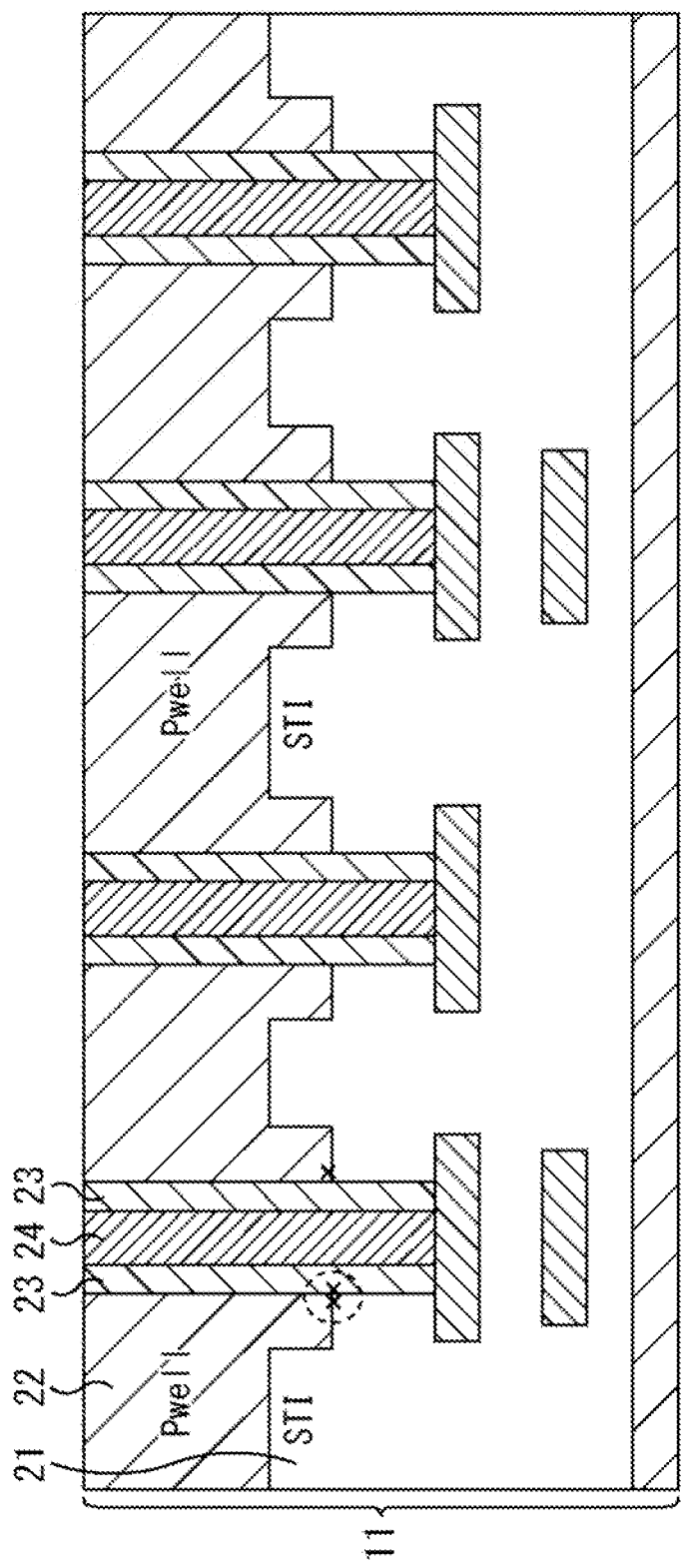
FIG. 4 is a view illustrating the cause of the breakdown phenomenon of the side wall insulating film of the Si substrate.

As apparent from comparison between the related-art configuration depicted in FIG. 2 and the present embodiment depicted in FIG. 5, in the present embodiment, formed is a protection diode structure including a P well region 22 and an N+ diffusion layer 41 by providing, as an upper layer of a STI 21 in which the through electrode is formed, the N+ diffusion layer 41 having a conductivity of a type opposite to that of the P well region 22 and in a floating state having a potential that is not fixed.

Since the electrode equipment includes the protection diode structure, charge fixed in the proximity of the boundary between the P well region 22 and the STI 21 in the related-art structure remains in the N+ diffusion layer 41. Accordingly, since electric field concentration from the proximity of the boundary between the P well region 22 and the STI 21 toward the electrode material 24 does not occur either, the side wall insulating film 23 is suppressed from being broken down. It is to be noted that the protection diode structure may otherwise include an N well region and a P+ diffusion layer in the first semiconductor substrate 51.

<Manufacturing Method of Electronic Equipment that is Embodiment of Present Technology>

Now, a manufacturing method of the electronic equipment that is the embodiment of the present technology depicted in FIG. 5 is described with reference to FIGS. 6 to 10.

Figure 6:
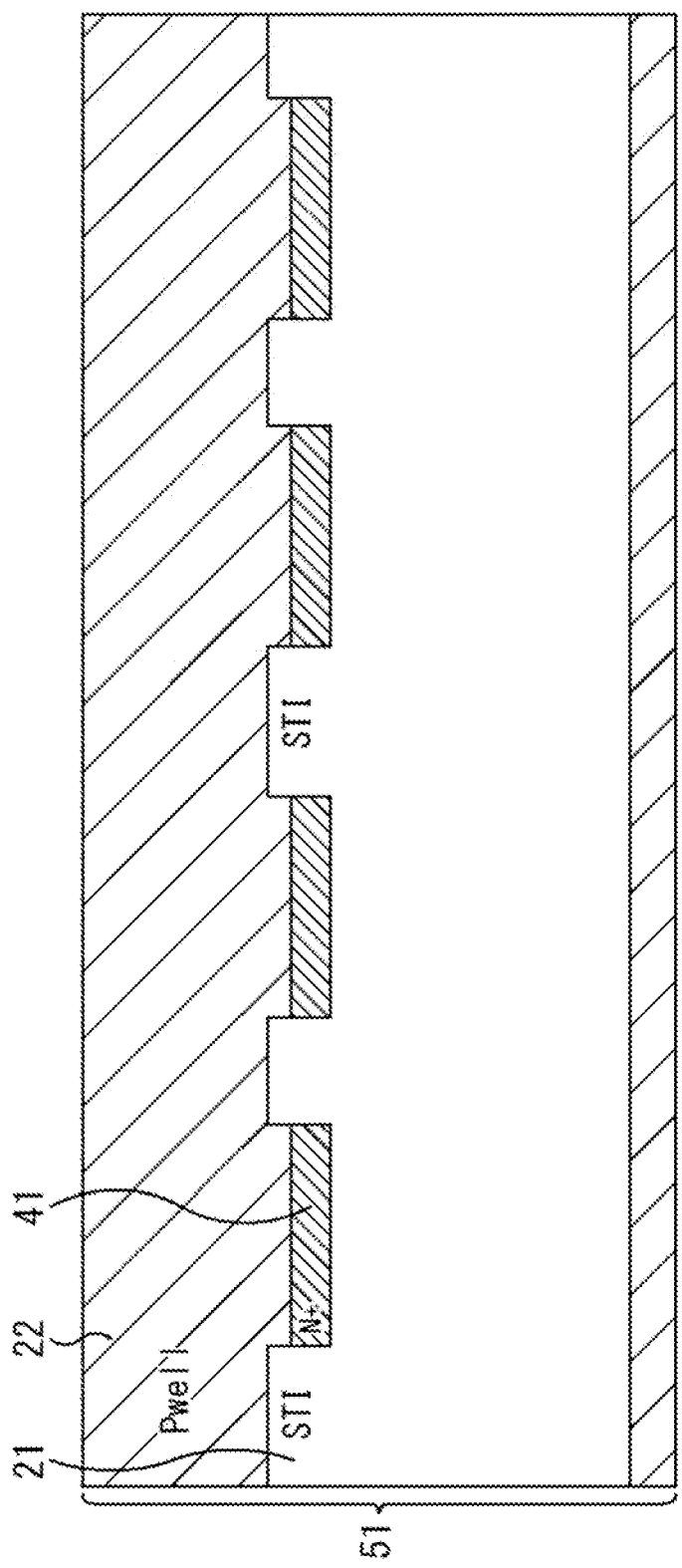
FIG. 6 is a view illustrating a manufacturing process of the electronic equipment depicted in FIG. 5.

FIG. 6 depicts a cross sectional view of the first semiconductor substrate 51 before a through-hole 61 for forming a through electrode 52 is opened.

First, before a through-hole 61 is opened, a protection diode structure that can be formed in a MOS transistor formation process is formed in a first semiconductor substrate 51 as depicted in FIG. 6.

In particular, an STI 21 that is formed in a recessed shape individually at each position at which each through electrode 52 is to be formed in the first semiconductor substrate 51, and an N+ diffusion layer 41 is formed in each recessed portion of the STI 21.

It is to be noted that, since the recessed portions of the STI 21 are formed with a depth sufficient to isolate the N+ diffusion layers 41, each of which is to be disposed around each through electrode 53, from each other, the protection diode structures that are formed around the through electrodes 53 are maintained in a mutually isolated state.

Figure 7:
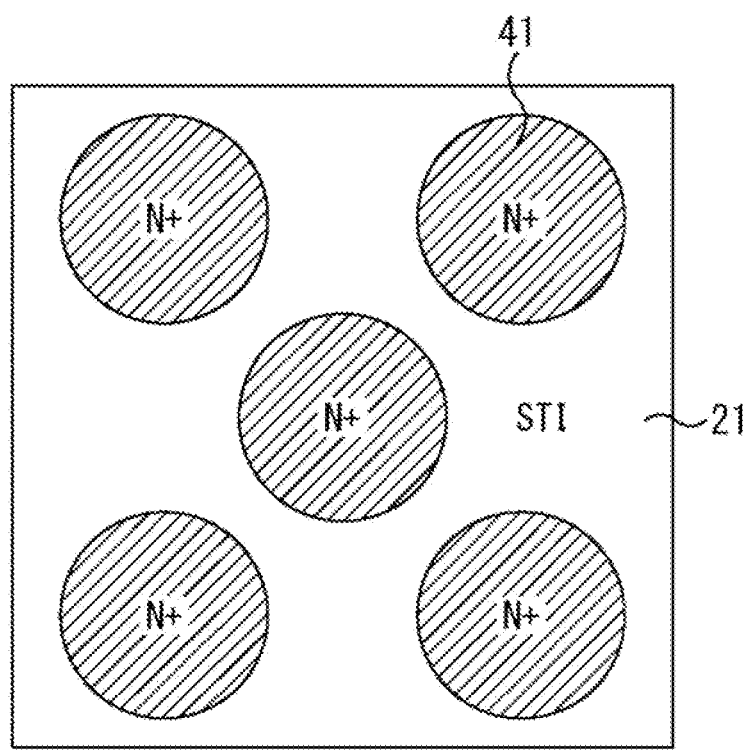
FIG. 7 is a view illustrating the manufacturing process of the electronic equipment depicted in FIG. 5.

Further, the cross sectional shape of each recessed portion of the STI 21 is formed in accordance with a cross sectional shape of the through electrode 52 to be formed in the recessed portion. For example, in the case where the sectional shape of the through electrode 52 is a circular shape, the recessed portions of the STI 21 and the N+ diffusion layer 41 are also formed in a circular shape as depicted in FIG. 7.

Thereafter, a P well region 22 is formed on an upper layer of the STI 21 and the N+ diffusion layer 41. Consequently, at positions at which the through electrodes 52 are to be formed, protection diode structures separate from and independent of each other are formed individually for the through electrodes 52 by the recessed portions of the STI 21.

Then, the first semiconductor substrate 51 in which the protection diode structures are formed and a second semiconductor substrate (not depicted) to be stacked on the same are pasted to each other with circuit faces thereof opposed to each other.

Figure 8:
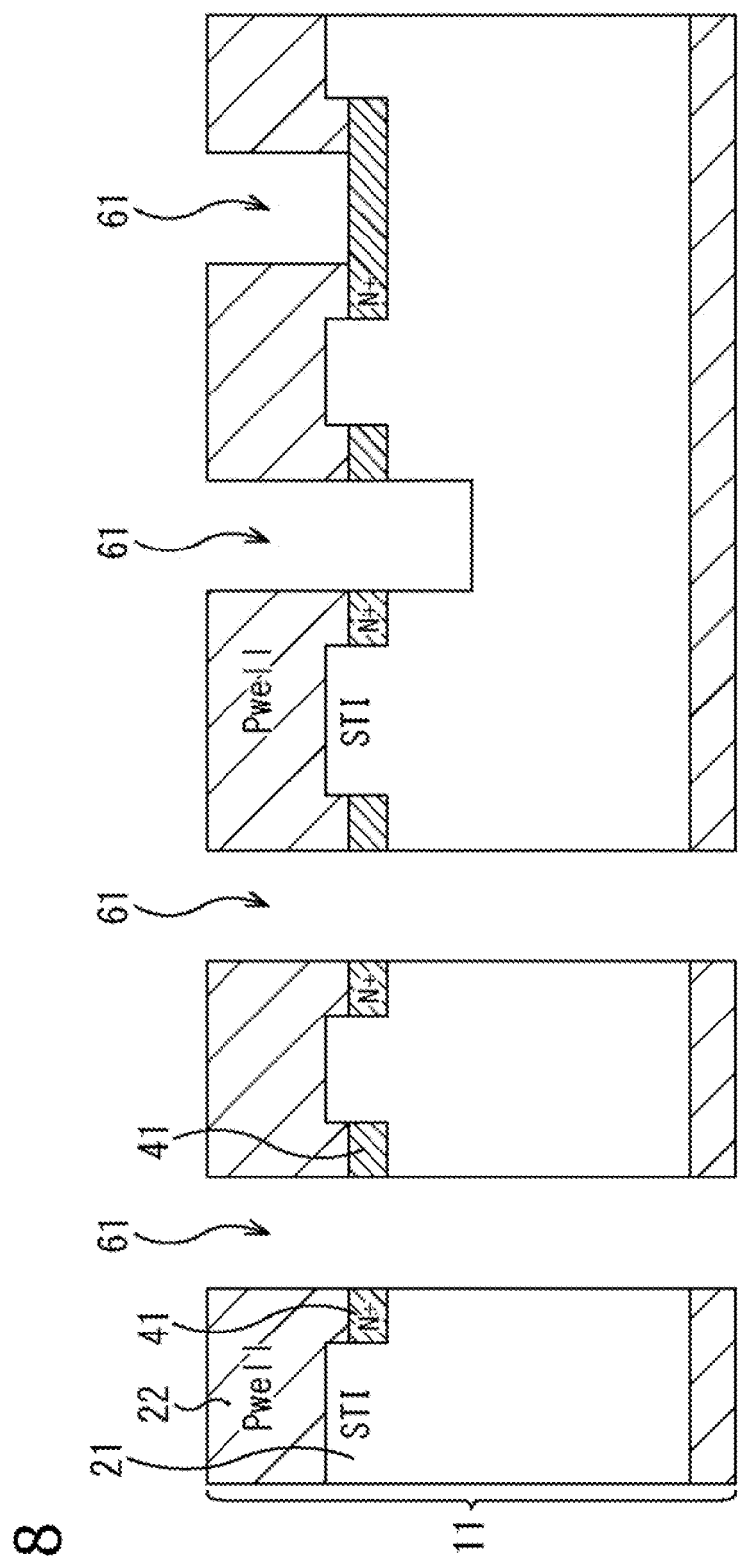
FIG. 8 is a view illustrating the manufacturing process of the electronic equipment depicted in FIG. 5.

Thereafter, as depicted in FIG. 8, the P well region 22 of the Si substrate 51 is made thinner to a desired thickness, and then, through-holes 61 extending from the P well region 22 and the N+ diffusion layer 41 of the first semiconductor substrate 51 to the second semiconductor substrate are opened at the positions of the through electrodes 52 by dry etching.

Figure 9:
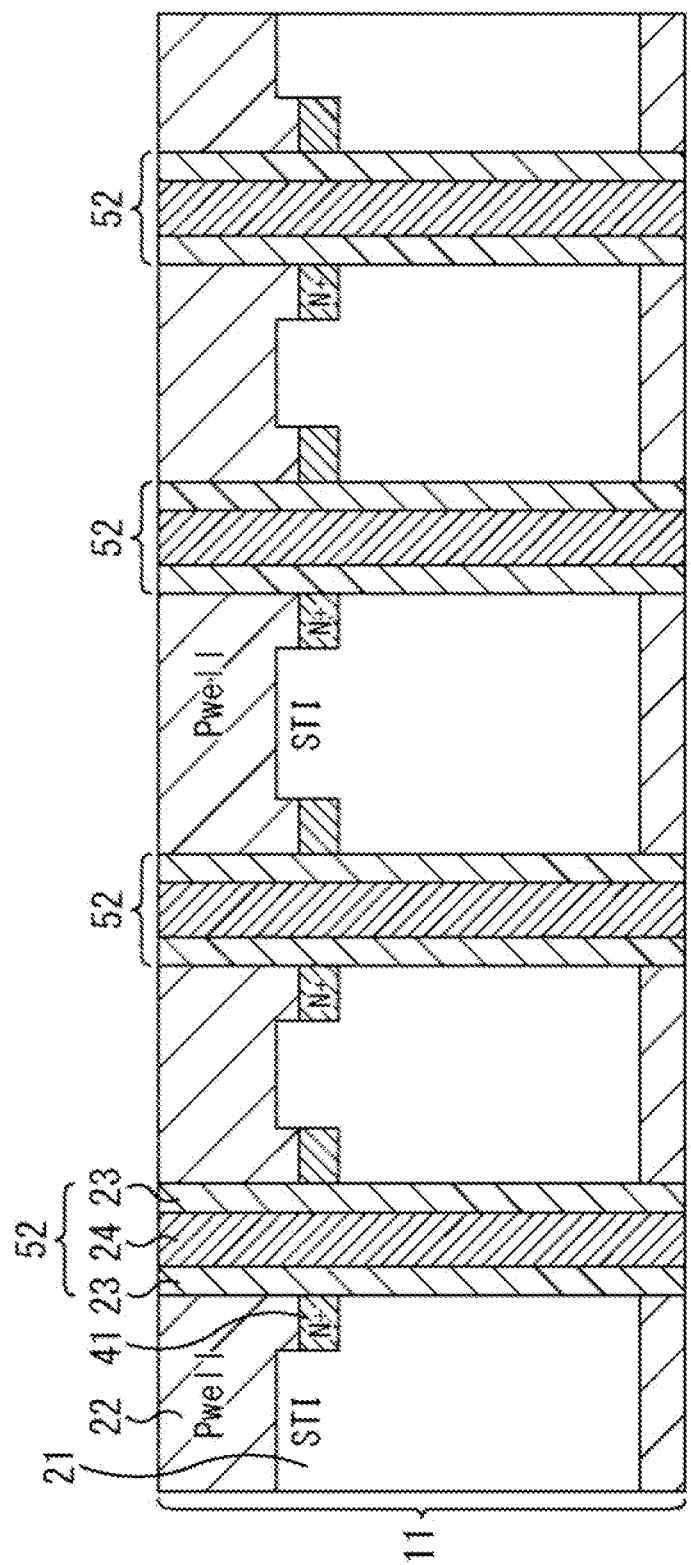
FIG. 9 is a view illustrating the manufacturing process of the electronic equipment depicted in FIG. 5.

Then, as depicted in FIG. 9, a side wall insulating film 23 such as an $SiO_2$ film or an SiN film is deposited on a side wall of each of the opened through-holes 61, and then, an electrode material 24 is filled to form through electrodes 52.

Figure 10:
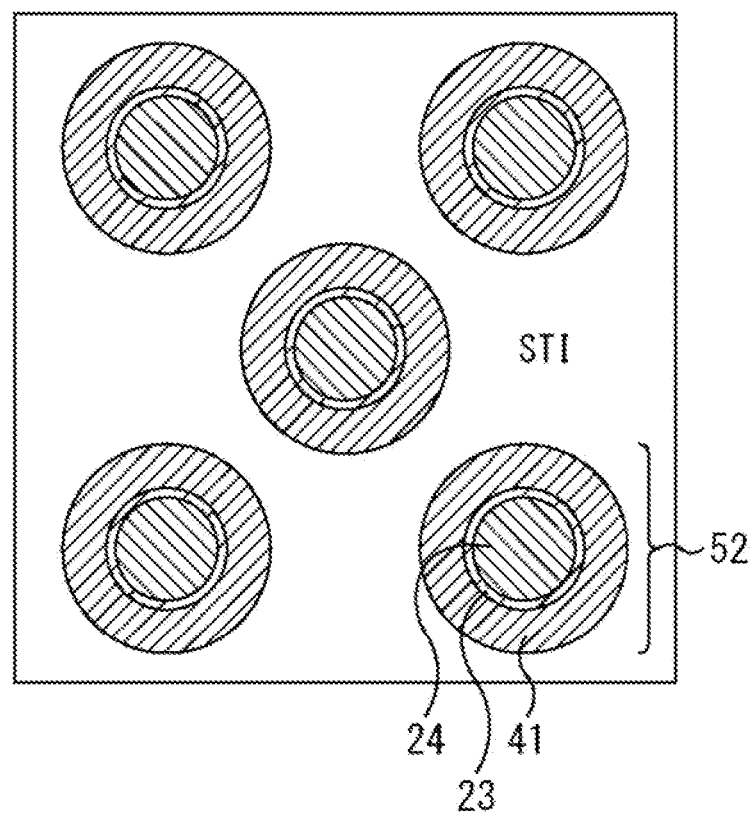
FIG. 10 is a view illustrating the manufacturing process of the electronic equipment depicted in FIG. 5.

FIG. 10 is a sectional view of the through electrodes 52 formed at recessed portions of the STI 21 in the first semiconductor substrate 51. As depicted in FIG. 10, a side wall insulating film 23, an N+ diffusion layer 41, and an STI 21 are formed in this order around the electrode material 24 that forms each of the through electrodes 52. More specifically, since a junction potential barrier by the N+ diffusion layer 41 is present between the side wall insulating film 23 and the STI 21, movement of charge from the P well region 22 to the STI 21, which has occurred upon opening of a through-hole in the related-art configuration, is suppressed.

Further, since the N+ diffusion layers 41 around the through electrodes 52 are electrically isolated from each other by the recessed portions of the STI 21, even if timings at which a plurality of through-holes reaches the STI 21 suffer from dispersion, charge dispersed in the P well region 22 is not concentrated upon the through-hole that reaches the P well region 22 first, and a dispersed state is maintained.

Therefore, since an electric field by excessive charge damage is not applied to the side wall insulating film 23, breakdown of the side wall insulating film 23 can be suppressed, and short-circuiting that could have occurred between the first semiconductor substrate and a through electrode can be suppressed.

<Particular Examples of Solid-State Imaging Element that is Embodiment of Present Technology>

Figure 11:
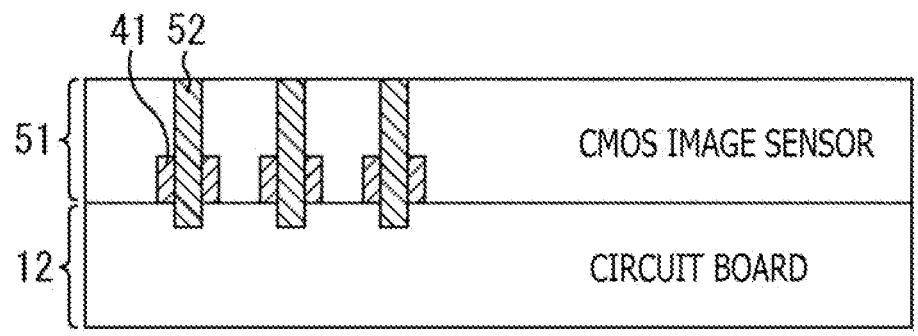
FIG. 11 is a view depicting a first configuration example of a solid-state imaging element to which the present technology is applied.

Next, FIG. 11 depicts a sectional view of a first configuration example of the solid-state imaging element that is an embodiment of the present technology.

In the solid-state imaging element, a first semiconductor substrate 51 on which a CMOS image sensor including a PD (photodiode), a pixel transistor, and so forth is formed and which has a protection diode structure and a second semiconductor substrate 12 including various signal processing circuits and so forth are pasted to and stacked on each other, and through-holes are opened from the rear face side (upper side in FIG. 11) of the first semiconductor substrate 51 to form through electrodes 52.

Thereafter, if color filters, on-chip lenses, pad electrodes, and so forth are formed on the rear face side of the first semiconductor substrate 51 and the stacked substrate is then singulated, the first configuration example of the solid-state imaging element that is the embodiment of the present technology is then completed.

Figure 12:
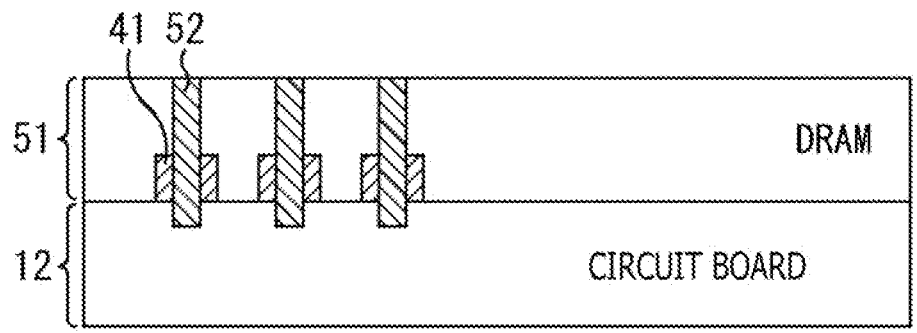
FIG. 12 is a view depicting a configuration example of a semiconductor device to which the present technology is applied.

FIG. 12 depicts a sectional view of a configuration example of a semiconductor device that is an embodiment of the present technology.

In the semiconductor device, a first semiconductor substrate 51 on which a semiconductor memory represented by a DRAM is formed and which has a protection diode structure and a second semiconductor substrate 12 including various signal processing circuits and so forth are stacked on each other, and through-holes are opened from the rear face side (upper side in FIG. 12) of the first semiconductor substrate 51 to form through electrodes 52.

Thereafter, if pad electrodes and so forth are formed on the rear face side of the first semiconductor substrate 51 and the stacked substrate is then singulated into individual chips, a semiconductor device of the stacked type that is an embodiment of the present technology is then completed.

Figure 13:
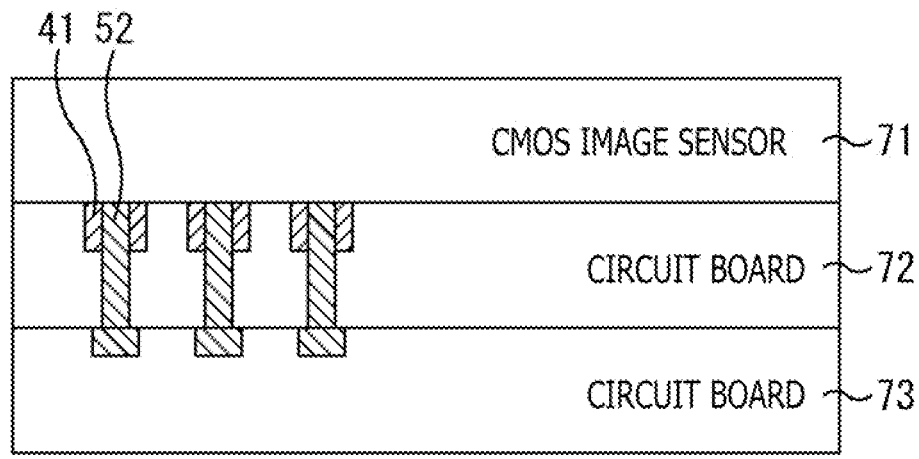
FIG. 13 is a view depicting a second configuration example of a solid-state imaging element to which the present technology is applied.

FIG. 13 depicts a sectional view of a second configuration example of a solid-state imaging element that is an embodiment of the present technology.

In the solid-state imaging element, a CMOS image sensor substrate 71 including PDs, pixel transistors, and so forth and a circuit board 72 (corresponding to the first semiconductor substrate 11) having a protection diode structure are pasted to and stacked on each other, and through-holes are opened from the side of the circuit board 72 on which the CMOS image sensor substrate 71 is not stacked to form through electrodes 52.

Thereafter, on the side of the circuit board 72 on which the CMOS image sensor substrate 71 is not stacked, a circuit board 73 on which contact pads to the through electrode 52 are exposed is pasted.

Thereafter, if color filters, on-chip lenses, pad electrodes, and so forth are formed on the rear face side (upper side in FIG. 13) of the CMOS image sensor substrate 71 and the stacked substrate is then singulated into individual chips, the second configuration example of the solid-state imaging element that is an embodiment of the present technology is then completed.

Figure 14:
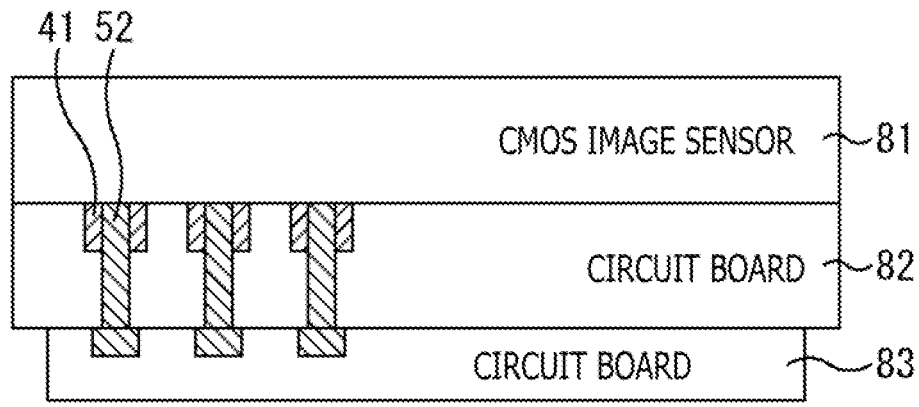
FIG. 14 is a view depicting a third configuration example of a solid-state imaging element to which the present technology is applied.

FIG. 14 depicts a sectional view of a third configuration example of a solid-state imaging element that is an embodiment of the present technology.

In the solid-state imaging element, a CMOS image sensor substrate 81 including PDs, pixel transistors, and so forth and a circuit board 82 (corresponding to the first semiconductor substrate 11) having a protection diode structure are pasted to and stacked on each other, and through-holes are opened from the side of the circuit board 82 on which the CMOS image sensor substrate 81 is not stacked to form through electrodes 52.

Thereafter, on the side of the circuit board 82 on which the CMOS image sensor substrate 81 is not stacked, a circuit board chip 83 on which connection pads to the through electrode 52 are exposed is pasted.

Thereafter, if color filters, on-chip lenses, pad electrodes, and so forth are formed on the rear face side (upper side in FIG. 14) of the CMOS image sensor substrate 81 and the stacked substrate is then singulated into individual chips, the third configuration example of the solid-state imaging element that is the embodiment of the present technology is then completed.

<Application Example to In-Vivo Information Acquisition System]

The technology according to the present disclosure (present technology) can be applied to various produces. For example, the technology according to the present disclosure may be applied to an endoscopic surgery system.

Figure 15:
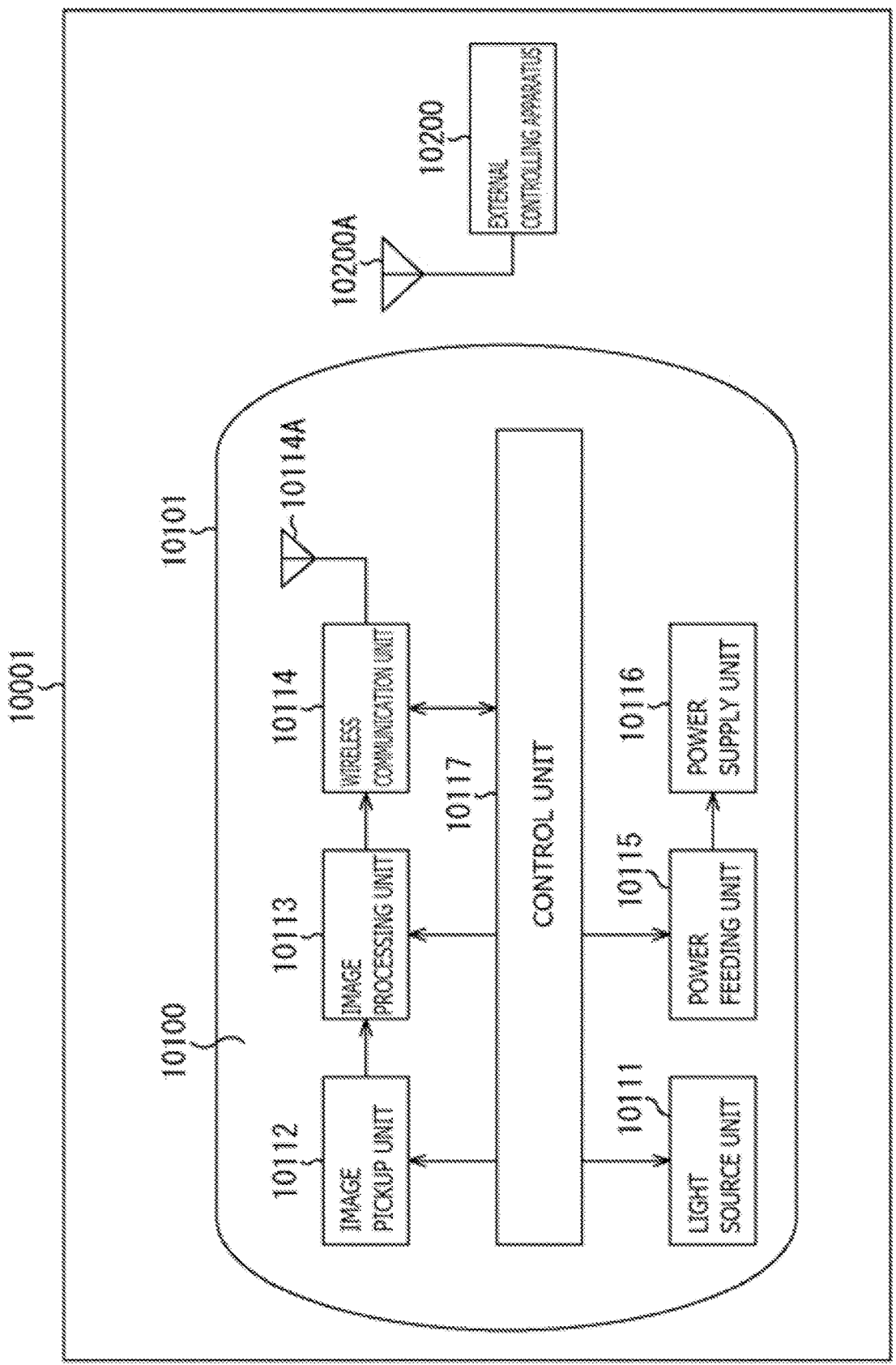
FIG. 15 is a block diagram depicting an example of a schematic configuration of an in-vivo information acquisition system.

FIG. 15 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 15, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of an in-vivo information acquisition system to which the technology according to the present disclosure can be applied has been described. The technology according to the present disclosure can be applied to the imaging section 10112 in the configuration described above.

<Application Example of Mobile Body>

The technology according to the present disclosure (present technology) can be applied to various products. For example, the technology according to the present disclosure may be implemented as an apparatus that is incorporated in any type of mobile body such as an automobile, an electric car, a hybrid electric car, a motorcycle, a bicycle, a personal mobility, an airplane, a drone, a ship, a robot, and so forth.

Figure 16:
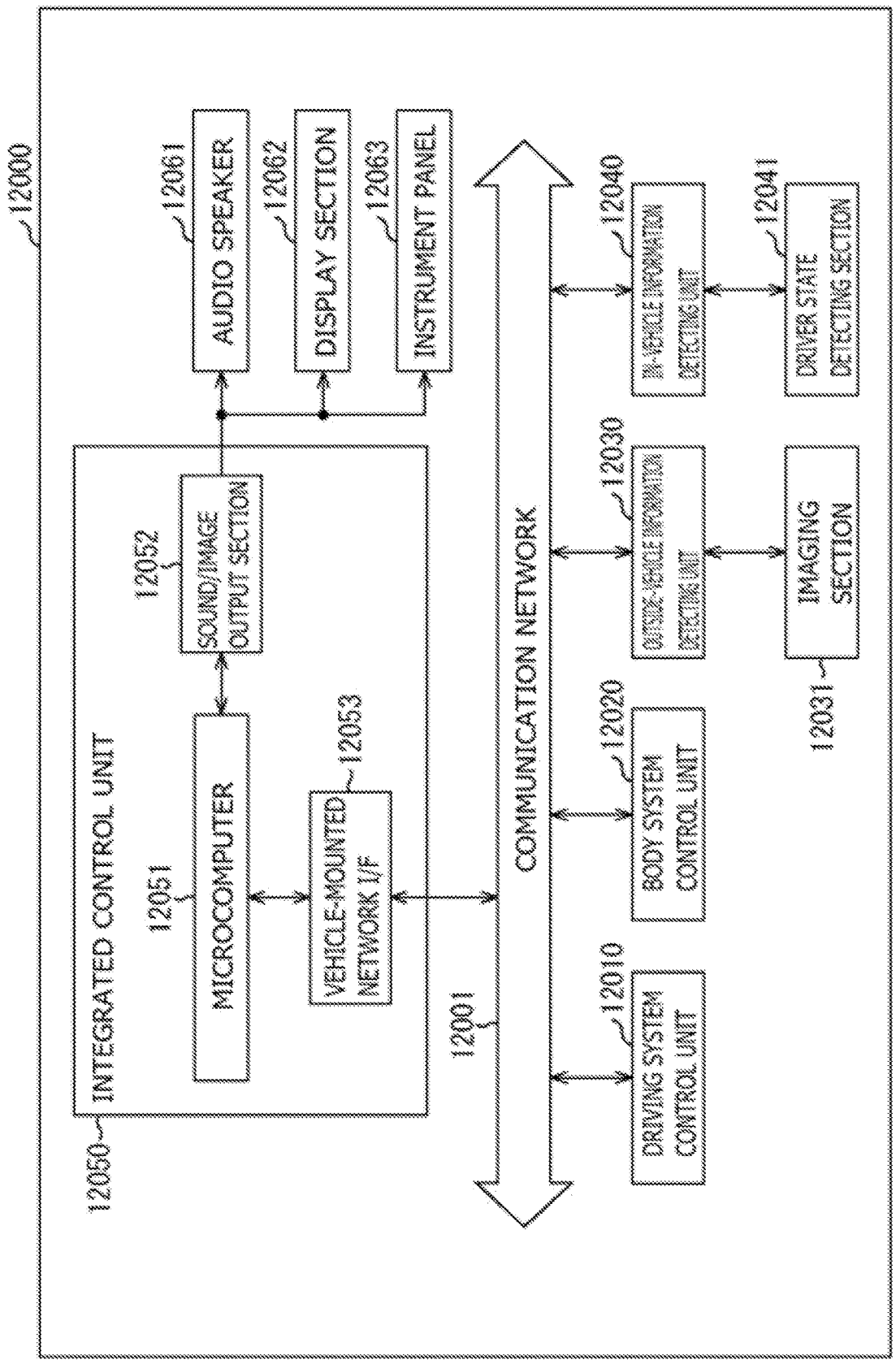
FIG. 16 is a block diagram depicting an example of schematic configuration of a vehicle control system.

FIG. 16 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 16, an audio speaker 12061, a display section 12062, and an instrument panel 12063 are illustrated as the output device. The display section 12062 may, for example, include at least one of an on-board display and a head-up display.

Figure 17:
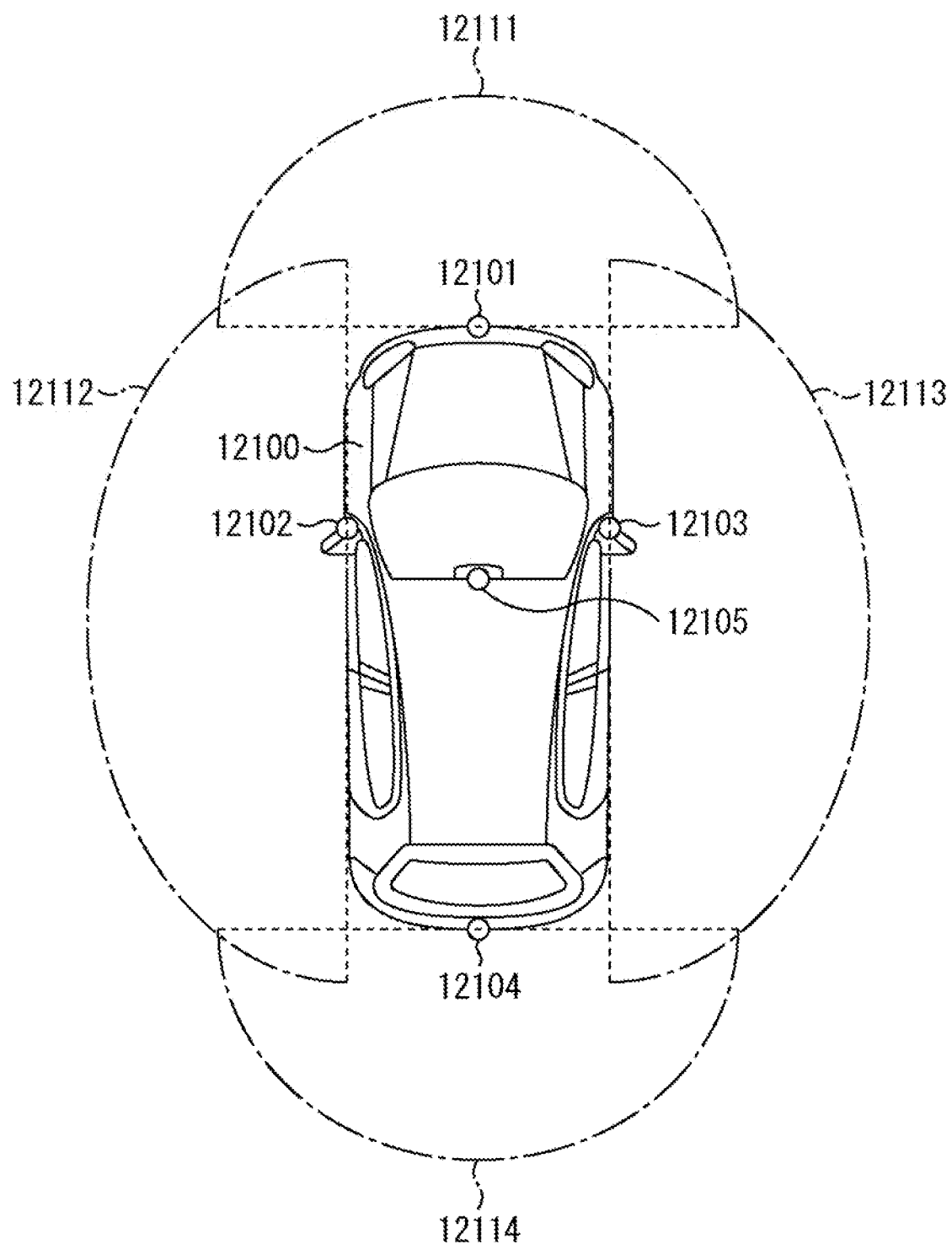
FIG. 17 is a diagram of assistance in explaining an example of installation positions of an outside-vehicle information detecting section and an imaging section.

FIG. 17 is a diagram depicting an example of the installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure can be applied has been described. The technology according to the present disclosure can be applied to the imaging section 12031 in the configuration described above.

It is to be noted that the embodiment of the present technology is not limited to the embodiments described hereinabove, and various alterations are possible without departing from the subject matter of the present technology.

It is to be noted that the present technology can assume also such configurations as described below.

(1)

A semiconductor device including:

a first semiconductor substrate on which a given circuit is formed;

a second semiconductor substrate pasted to the first semiconductor substrate; and through electrodes electrically connecting the first semiconductor substrate and the second semiconductor substrate to each other, in which each of the through electrodes is formed such that a through-hole is opened through a protection diode structure formed in the first semiconductor substrate, an insulating film is deposited on a side wall of the through-hole, and an electrode material is then filled inside the through-hole in which the insulating film is deposited.

(2)

The semiconductor device according to (1) above, in which the through electrode is formed such that the through-hole is opened through the protection diode structure including a well region of one of a P type and an N type formed in the first semiconductor substrate and a diffusion layer of the other of the P type and the N type stacked and formed in the well region, and the insulating film is deposited on the side wall of the through-hole and the electrode material is then filled in the through-hole in which the insulating film is deposited.

(3)

The semiconductor device according to (1) or (2) above, in which the protection diode structure is formed for each of the through electrodes.

(4)

The semiconductor device according to (2) or (3) above, in which the diffusion layer of the other of the P type and the N type stacked and formed on the well region is formed in a recessed portion of an STI provided individually for each of the through electrodes.

(5)

A manufacturing method of a semiconductor device that includes a first semiconductor substrate on which a given circuit is formed, a second semiconductor substrate pasted to the first semiconductor substrate, and through electrodes electrically connecting the first semiconductor substrate and the second semiconductor substrate to each other, the manufacturing method including:

forming a diffusion layer of one of a P type and an N type on the first semiconductor substrate and stacking a well region of the other of the P type and the N type on an upper layer of the diffusion layer to form a protection diode structure;

pasting the first semiconductor substrate in which the protection diode structure is formed, and the second semiconductor layer to each other;

opening a through-hole through the protection diode structure from the first semiconductor substrate side;

depositing an insulating film on a side wall of the opened through-hole; and filling up an electrode material inside the through hole in which the insulating film is deposited, to form the through electrode.

(6)

A solid-state imaging element including:

a first semiconductor substrate on which at least a photoelectric conversion element and a pixel transistor are formed;

a second semiconductor substrate pasted to the first semiconductor substrate; and through electrodes electrically connecting the first semiconductor substrate and the second semiconductor substrate to each other, in which each of the through electrodes is formed such that a through-hole is opened through a protection diode structure formed in the first semiconductor substrate and an insulating film is deposited on a side wall of the through-hole and besides an electrode material is then filled inside the through-hole in which the insulating film is deposited.

(7)

Electronic equipment in which a semiconductor device is incorporated, the semiconductor device including:

a first semiconductor substrate on which a given circuit is formed;

a second semiconductor substrate pasted to the first semiconductor substrate; and through electrodes electrically connecting the first semiconductor substrate and the second semiconductor substrate to each other, in which each of the through electrodes is formed such that a through-hole is opened through a protection diode structure formed in the first semiconductor substrate, an insulating film is deposited on a side wall of the through-hole, and an electrode material is then filled inside the through-hole in which the insulating film is deposited.

REFERENCE SIGNS LIST

11 First semiconductor substrate, 12 Second semiconductor substrate, 13 Through electrode, 21 STI, 22 P well region, 23 Side wall insulating film, 24 Electrode material, 31 Through-hole, 41 N+ diffusion layer, 51 First semiconductor substrate, 52 Through electrode, 61 Through-hole

What is claimed is:

1. A semiconductor device, comprising:
a first semiconductor substrate;
a through hole extending into the first semiconductor substrate;
a sidewall insulating film on a sidewall of the through hole;
an electrode material in the through hole and separated from the first semiconductor substrate in at least sidewall portions of the through hole by the sidewall insulating film, wherein the sidewall insulating film and the electrode material form at least a portion of a through electrode;
a shallow trench isolation formed in the first semiconductor substrate; and
a protection diode structure in an area of the shallow trench isolation, wherein the through electrode extends through the protection diode structure, wherein the protection diode structure includes a well region of one of a P type and an N type formed in the first semiconductor substrate and a diffusion layer of the other of the P type and the N type.

2. The semiconductor device according to claim 1, wherein the well region is a P well region, and wherein the diffusion layer is an N type diffusion layer.

3. The semiconductor device according to claim 2, wherein the diffusion layer is an N+ type diffusion layer.

4. The semiconductor device according to claim 1, wherein the semiconductor device includes a plurality of through electrodes, and wherein a protection diode structure is provided individually for each of the through electrodes.

5. The semiconductor device according to claim 4, wherein at least a first one of the through electrodes extends into the first semiconductor substrate to a first depth, and wherein a second one of the through electrodes extends into the first semiconductor substrate to a second depth.

6. The semiconductor device according to claim 1, wherein the first semiconductor substrate is a Si substrate.

7. The semiconductor device of claim 6, wherein the sidewall insulating film is an $SiO_2$ film or an SiN film.

8. An electronic apparatus, comprising:
a first semiconductor substrate;
a through hole extending into the first semiconductor substrate;
a sidewall insulating film on a sidewall of the through hole;
an electrode material in the through hole and separated from the first semiconductor substrate in at least sidewall portions of the through hole by the sidewall insulating film, wherein the sidewall insulating film and the electrode material form at least a portion of a through electrode;
a shallow trench isolation formed in the first semiconductor substrate;
a protection diode structure in an area of the shallow trench isolation, wherein the through electrode extends through the protection diode structure, wherein the protection diode structure includes a well region of one of a P type and an N type formed in the first semiconductor substrate and a diffusion layer of the other of the P type and the N type; and
a second semiconductor substrate, wherein the second semiconductor substrate is stacked on the first semiconductor substrate, and wherein the through electrode at least partially penetrates the second semiconductor substrate.

9. The electronic apparatus according to claim 8, wherein the well region is a P well region, and wherein the diffusion layer is an N type diffusion layer.

10. The electronic apparatus according to claim 9, wherein the diffusion layer is an N+ type diffusion layer.

11. The electronic apparatus according to claim 8, wherein the electronic apparatus includes a plurality of through electrodes, and wherein a protection diode structure is provided individually for each of the through electrodes.

12. The electronic apparatus according to claim 8, wherein the first semiconductor substrate is a Si substrate.

13. The electronic apparatus of claim 12, wherein the sidewall insulating film is an $SiO_2$ film or an SiN film.

14. The electronic apparatus of claim 8, wherein a complementary metal oxide semiconductor image sensor including a photodiode is formed on the first semiconductor substrate.

15. The electronic apparatus of claim 14, wherein the second semiconductor substrate includes signal processing circuits.

\* \* \* \* \*